United States Patent [19]

Wakamatsu

[11] Patent Number: 4,839,306
[45] Date of Patent: Jun. 13, 1989

[54] METHOD OF MANUFACTURING A TRENCH FILLED WITH AN INSULATING MATERIAL IN A SEMICONDUCTOR SUBSTRATE

[75] Inventor: Hidetoshi Wakamatsu, Tokyo, Japan

[73] Assignee: Oki Electric Industry Co., Ltd., Tokyo, Japan

[21] Appl. No.: 174,453

[22] Filed: Mar. 23, 1988

[30] Foreign Application Priority Data

Mar. 24, 1987 [JP] Japan .................................. 62-69785

[51] Int. Cl.$^4$ .......................................... H01L 21/306
[52] U.S. Cl. ......................................... 437/67; 437/61; 437/228; 437/51; 437/40; 148/DIG. 50; 148/DIG. 158
[58] Field of Search ...................... 204/192.23, 192.37, 204/192.1, 192.3, 192.12; 156/644, 643; 148/DIG. 50, DIG. 158; 357/236; 437/47, 60, 203

[56] References Cited

U.S. PATENT DOCUMENTS 4,007,103 2/1977 Baker et al. ..................... 204/192.12
4,702,795 10/1987 Douglas .............................. 437/225
4,749,663 6/1988 Okita .................................... 437/228

FOREIGN PATENT DOCUMENTS 0202560 11/1983 Japan .................................. 156/644
0142764 6/1986 Japan ..................................... 437/67
0288428 12/1986 Japan .
2159326 11/1985 United Kingdom ................ 357/236

OTHER PUBLICATIONS

Bassous "Low Temperature Methods for Rounding Silicon Nozzles", IBM TDB, vol. 20, No. 2, Jul. 1977, pp. 810–811.

Primary Examiner—Brian E. Hearn
Assistant Examiner—Tom Thomas
Attorney, Agent, or Firm—Wenderoth, Lind & Ponack

[57] ABSTRACT

A method of manufacturing a trench filled with an insulation material in a semiconductor substrate which includes the steps of forming a trench in the substrate, subjecting the substrate to an RF bias sputtering to form an oxide layer on the substrate, form a slope at an upper corner of the trench and produce a roundness at a lower corner of the trench, and filling the trench with the insulation material.

8 Claims, 2 Drawing Sheets

METHOD OF MANUFACTURING A TRENCH FILLED WITH AN INSULATING MATERIAL IN A SEMICONDUCTOR SUBSTRATE

BACKGROUND OF THE INVENTION (1) Field of the Invention

This invention relates to a method of manufacturing a trench filled with an insulating material in a semiconductor substrate. The trench is available for a capacitor and the isolation of a semiconductor substrate.

(2) Description of the Related Art

Highly integrated semiconductor devices require a fine processing technique.

A trench isolation technique without the production of a bird's beak and the formation of a trench capacitor of high density have been recently becoming important.

The depth and shape of a trench in a semiconductor depend how the trench is applied. A trench having the slope in the upper part is described in Japanese Journal of Applied Physics, Volume 21 (1982) Supplement 21-1, pp. 37–40. The slope makes it easy to fill oxide material into the trench.

However, as the bottom part of the trench has an L shaped profile, the oxide becomes thinner at the bottom and the stress is generated when the oxide is formed. The thin oxide formed at the bottom deteriorates the withstand voltage and the stress creates crystal lattice defects in the substrate.

SUMMARY OF THE INVENTION

It is an object of the present invention to provide a method of manufacturing a trench structure in a semiconductor substrate for high-reliability semiconductor devices.

In accordance with the present invention, there is provided a method of manufacturing a trench filled with an insulation material in a semiconductor substrate comprising the steps of:

forming the trench in the substrate;

subjecting the substrate to an RF bias sputtering to form an oxide layer on the substrate, form a slope at an upper corner of the trench and to produce a roundness at a lower corner of the trench; and filling the trench with the insulating material.

DESCRIPTION OF THE PREFERRED EMBODIMENTS

The first embodiment of the present invention will now be described in detail with reference to FIG. 1(a) to FIG. 1(e).

Figure 1A:
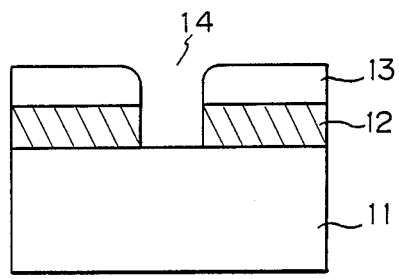
FIG. 1(a)–FIG. 1(e) are sectional views of a semiconductor substrate in different steps according to the first embodiment of the present invention.

In the step of FIG. 1(a), non doped silicon oxide (SiO$_2$) is deposited on a (100) axis P-type silicon substrate 11 by an atmospheric pressure clemical vapor deposition (CVD) technique. Then, a silicon oxide layer 12 having a thickness of 3,000 to 7,000 Å is deposited on the substrate 11. Consequently, a resist film 13 is coated on the silicon oxide layer 12. A predetermined region for trench isolation of the resist film 13 is etched off to form an opening 14. A positive type resist called OFPR-800 (product name made by Tokyo Oka Co., Ltd.), for example, is used as the resist film 13 having a thickness of 9,000 to 10,000 Å. Next, the exposed (opening region of) silicon oxide layer 12 is etched off by reactive ion etching (RIE).

Figure 1B:
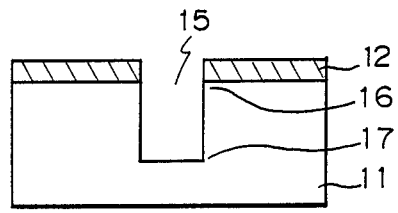

In the step of FIG. 1(b), after removing the resist 13, a trench 15 is formed in the substrate 11 by RIE using the silicon oxide layer 12 as an etching mask. The trench 15 is 4 μm in depth and the side wall is vertical or has a slope having an angle of about 80° from the surface of the substrate 11.

As the RIE etching rate ratio of the silicon substrate 11 to the silicon oxide layer 12 is 10 to 1, the layer 12 is reduced by etching about 4,000 Å in thickness. The slope angle θ can be varied by the forming conditions of a reactively deposited layer such as an oxide layer. In this embodiment, the upper corner 16 and the lower corner 17 have angles of about 90°.

Figure 1C:
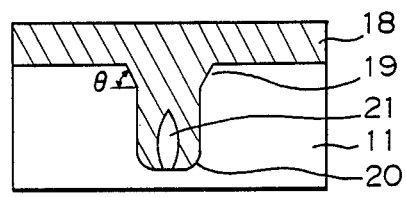

In the step of FIG. 1(c), after completely removing the oxide layer 12 by a 5% HF solution, a silicon oxide layer 18 is deposited on the entire surface of the silicon substrate 11 by an RF bias sputtering. The forming condition of the oxide layer 18 is, for example, shown in the following Table I.

TABLE I

| Title | condition |
| --- | --- |
| Type of sputtering apparatus | one by one treated parallel flat type |
| Vacuum level of preparatory exhaustion | 7 × 10$^{-7}$ Torr |
| Argon gas pressure | 2.0 Pa |
| Target power | 1 kW |
| Substrate DC bias* | −300 V |
| Deposit rate | 250 Å/min |

*Resputtering ratio is 40%

A slope 19 and a roundness portion 20 are formed by this sputtering process. As the RF bias sputtering is a method for etching and depositing simultaneously, a damage layer is formed at the upper and the lower portion of the trench 15. The slope angle θ and the radius of curvature of the roundness 20 can be controlled by the DC bias condition. For example, as the negative DC bias increases, the angle θ becomes closer to 90°. The angle θ can be preferably varied to an extent of between 30° and 50°. The radius of curvature of the roundness 20 can be also controlled in the same manner as mentioned above. Changing the DC bias conditions make the above mentioned etching and depositing method possible without a hole 21 in trench 15.

Figure 1D:
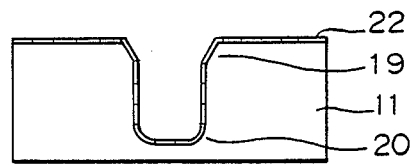

In the step of FIG. 1(d), after completely removing the oxide layer 18 by the 5% HF solution, a thermal silicon oxide layer 22 of 500 to 1,000 Å in thickness is formed on the entire surface of the substrate 11, including the trench 15, by subjecting the above entire surface to a high temperature oxidization treatment under a dry oxygen atmosphere. This is carried out to remove etching damages caused in the many steps of forming the trench 15, the slope 19 and the roundness 20, to round the slope 19 and roundness 20 and to keep the inner wall of the trench 15 smooth.

Figure 1E:
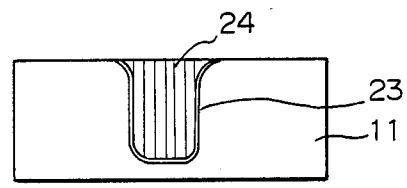
Figure 2A:
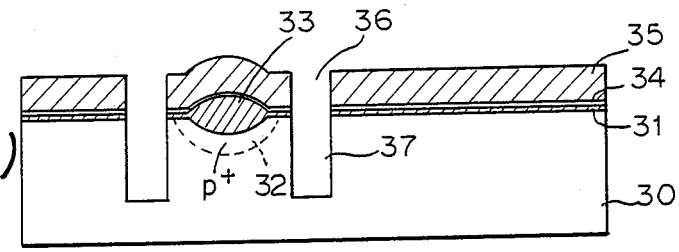
FIG. 2(a)–FIG. 2(d) are sectional views of a semiconductor substrate in different steps according to the second embodiment of the present invention.
Figure 2B:
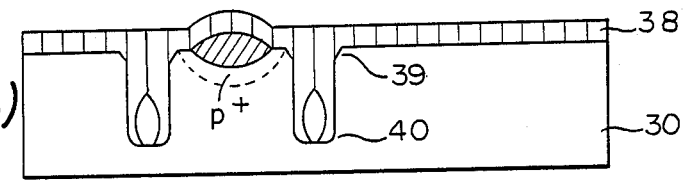
Figure 2C:
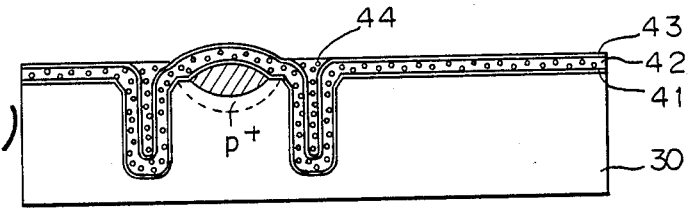
Figure 2D:
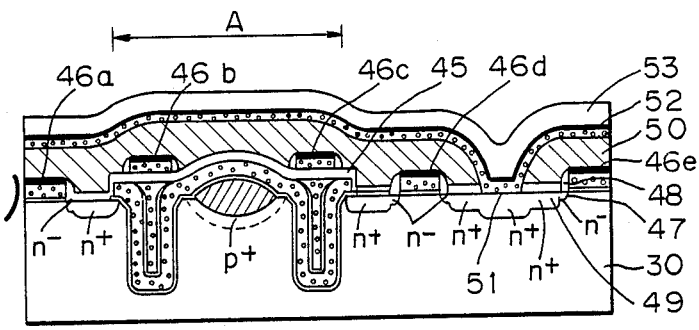

In the step of FIG. 1(e), the thermal oxide layer 22 is completely removed by the 5% HF solution. Thereafter, a thermal silicon oxide layer 23 of 200 to 1,000 Å in thickness is formed of the entire surface of the substrate 11, including the trench 15, by subjecting the above entire surface to a high temperature oxidization treatment under a dry oxygen atmosphere. Next, silicon oxide is deposited on the entire surface of the substrate 11 by a CVD technique to form a CVD silicon oxide layer 24 until the trench 15 is filled with the oxide and the surface of the CVD layer 24 becomes flat. The CVD layer 24 is preferably a silicon oxide layer with good coverage, for example, a silicon oxide layer formed by a reduced pressure CDV technique using $Si(OC_2H_6)_4$ and $O_2$ as reactive gases at a temperature of 720° C. under a pressure of 0.3 Torr. Next, after being etched by the RIE, the CVD oxide layer 24 remains only in the trench 15, and an isolation region with a flat surface is formed. As a material filling in the trench 15, it is possible to use a polycrystalline silicone. However, in case of using the polycrystalline silicon, it is necessary to subject the surface of the remained polycrystalline silicon in the trench to a heat oxidization treatment.

The RIE conditions of the above layers are, for example, shown in the following Table II.

TABLE II

| Etching layer | RF power | Pressure | Reactive gases and rate of flow | Etching rate |
|---|---|---|---|---|
| $SiO^2$ | 2.1 kW | 80 Pa | $C_6F_6$ 50 cc/min., $CHF_3$ 10 cc/min. | 560 Å/min. |
| Poly Si | 500 W | 0.03 Torr | $SF_6$ 15 cc/min., $C^2Cl$ $SF_5$ 15 cc/min. | 2500 Å/min. |
| Si* | 0.14 $W/cm^2$ | 0.3 Pa | $SiCl_4$ 20 cc/min., $N_2$ 20 cc/min. | 1000 Å/min. |

*The RF power of Si is a power density

In the second embodiment of the present invention, the invention is applied to a memory circuit device comprising a trench capacitor and an MOS transistor as main elements. The second embodiment will now be described in detail with reference to FIG. 2(a) to FIG. 2(d).

An isolation silicon oxide layer 33 is formed on a (100) axis P-type silicon substrate 30 having 1.5 cm of an electrical resistivity as measured by the LOCOS techniue. Under the isolation silicon oxide layer 33, there is provided an ion implantation region 32 for preventing an inversion. The region 32 is formed by implanting impurity ions, for example, the boron ion (B+). Moreover, a silicon oxide layer 31 is formed on the substrate 30 and a silicon nitride layer (not shown) is formed on the oxide layer 31 by the LOCOS technique. Next, only the nitride layer on an isolation region is removed by phosphoric acid at a temperature of 175° C. A CVD silicon nitride layer 34 is deposited on the exposed oxide layer 31 and 33 by the low pressure CVD technique and a CVD silicon oxide layer 35 is deposited on the CVD nitride layer 34. The CVD oxide layer 35, the CVD nitride layer 34 and the oxide layer 31 are etched off by the RIE using a resist layer selectively formed on the CVD oxide layer as a mask to form an opening 36. After removing the resist layer, a trench 37 is formed by the RIE using the CVD oxide layer as a mask (FIG. 2(a)).

The CVD oxide layer 35, CVD nitride layer 34 and the oxide layer 31 are etched off by a 5% HF solution and a heated phosphoric acid solution. Next, a silicon oxide layer 38 is formed on the exposed substrate 30 by RF bias sputtering to form an upper corner 39 and a lower corner 40 in the same manner described in FIG. 1(c) (FIG. 2(b)).

After completely etching off the oxide layer 38 by the 5% HF solution, a thermal silicon oxide layer (not shown) is so formed in thickness of about 500 Å on the surface of the substrate 30 under a high oxidation atmosphere as to remove an etching damage of the RIE and a damage of the RF bias sputtering and as to round a sharp corner made by the RF bias sputtering. The thermal oxide layer is completely etched off by the 5% HF solution.

Next, a capacitor insulation layer 41 (for example $SiO_2$) is formed a thickness of about 200 Å under a high oxidization atmosphere. A polycrystalline silicon layer 42, used as a capacitor electrode, is deposited in a thickness of about 2,000 Å on the polycrystalline silicon 41 by the low pressure CVD technique. A silicon oxide layer 42 is formed in a thickness of about 200 Å on the surface of the polycrystalline silicon layer 42 under the high oxidation atmosphere. A polycrystalline silicon layer 44 is deposited in a thickness of about 1,000 Å on the oxide layer 43 by the low pressures CVD technique to fill up the trench 37 and this layer 44 is etched by the RIE to reserve the polycrystalline silicon layer in the trench 37 only (FIG. 2(c)). As the oxide layer 43 works as a stopper of the etching, so that we can reserve the polycrystalline silicon layer in the trench 37 only.

A silicon oxide layer 45 is deposited on the layer 43 and 44 in thickness of about 3,000 Å. Next, the substrate 30 is exposed except on a capacitor region A. A plurality of LDD (Lightly Doped Drain) type MOS transistors 46a, 46b and 46e with side walls made of a silicon oxide 48 and a plurality of word line electrodes 46b, 46c having the side walls 48 are formed. A gate electrode of the transistor has a polyside structure having low resistance. An $n^-$ region 47 and an $n^+$ region 49, which are expected to be the source and the drain of the transistor, are formed by an arsenic (As) ion implantation. Next, a boron phosphorus silicate glass film (BPSG film) 50 is deposited as an intermediate insulating film and a bit line contact 51 is formed by photoetching. After annealing under a nitrogen atmosphere at a high temperature for flattening the surface of the BPSG film 50, a bit line electrode 52 is formed on the film 50. The electrode 52 has a polyside structure comprising a polycrystalline silicon layer with a low resistance and a silicide. A insulation layer 53 is formed on the electrode 52 (FIG. 2(d)). Next, an aluminum (Al) electrode (word line) and a passivation layer is formed to complete a MOS device.

As described above, the present invention makes it possible to form the slope of the upper corner of the trench and the roundness of the lower corner of the trench simultaneously by the RF bias sputtering, therefore, the oxide layer doesn't become thinner at the corners of the trench. Thus, it is possible to improve the withstanding voltage of the oxide layer and to prevent any crystal lattice defects in the substrate. Furthermore, since the RF bias sputtering is carried out after forming the trench, so that we can form a submicron pattern and apply the process to any high integration without a problem.

What is claimed is:

1. A method of manufacturing a trench filled with an insulation material in a semiconductor substrate including the steps of:
   forming a trench in the substrate;
   subjecting the substrate to an RF bias sputtering to form an oxide layer on the substrate, form a slope at an upper corner of the trench and to produce a roundness at a lower corner of the trench;
   removing said oxide layer; and
   filling the trench with the insulating material.

2. A method as claimed in claim 1, wherein said substrate is a P-type silicon substrate and said oxide layer is a silicon oxide layer.

3. A method as claimed in claim 1, wherein said insulating material is silicon oxide.

4. A method as claimed in claim 1, wherein said insulating material is formed by chemical vapor deposition.

5. A method of manufacturing a trench filled with an insulating material in a semiconductor substrate including the steps of:
forming a trench in the substrate;
subjecting the structure obtained by said step to an RF bias sputtering to form an oxide layer on the substrate, form a slope at an upper corner of the trench and to produce a roundness in a lower corner of the trench;
removing said oxide layer;
subjecting the structure obtained by said steps to a high temperature oxidization treatment to remove etching damages caused by forming the trench, the slope and the roundness, so as to round the slope and maintain the roundness and to keep an inner wall of the trench smooth;
removing a silicon oxide layer formed by said oxidization; and
filling the trench with the insulation material.

6. A method as claimed in claim 5, wherein said step of forming the trench includes the steps of;
forming a silicon oxide layer on the substrate;
selectively forming a resist film on the silicon oxide layer;
subjecting the structure obtained by said steps to a reactive ion etching to form a trench.

7. A method as claimed in claim 5, said silicon oxide layer is formed by a normal pressure clemical vapor deposition.

8. A method as claimed in claim 5, wherein said filling step comprises the steps of:
subjecting the substrate to a high temperature oxidization treatment to form a silicon oxide layer on the substrate; and
depositing silicon oxide by a chemical vapor deposition to fill the trench with the silicon oxide.

* * * * *